(12) United States Patent
Bläsing et al.

(10) Patent No.: US 6,888,357 B2
(45) Date of Patent: May 3, 2005

(54) ELECTRIC CIRCUIT ARRANGEMENT AND METHOD FOR CHECKING THE INTACTNESS OF A PHOTODIODE ARRAY

(75) Inventors: Frank Bläsing, Werl (DE); Christian Schirp, Bochum (DE)

(73) Assignee: Leopold Kostal GmbH & Co. KG, Ludenscheid (DE)

( * ) Notice: Subject to any disclaimer, the term of this patent is extended or adjusted under 35 U.S.C. 154(b) by 101 days.

(21) Appl. No.: 10/420,223

(22) Filed: Apr. 22, 2003

(65) Prior Publication Data

US 2004/0004178 A1 Jan. 8, 2004

(30) Foreign Application Priority Data

May 7, 2002 (DE) .......................................... 102 20 306

(51) Int. Cl.[7] .......................... G01R 31/04; G01R 31/26
(52) U.S. Cl. ....................................... 324/538; 324/767
(58) Field of Search ................................ 324/538, 767; 340/635, 653; 250/559.01, 559.39

(56) References Cited

U.S. PATENT DOCUMENTS 6,316,955 B1    11/2001    Shimamura et al. ......... 324/767
6,608,293 B2 *  8/2003     Kuderer ...................... 250/200

FOREIGN PATENT DOCUMENTS

DE          4022837 A1    7/1990

* cited by examiner

*Primary Examiner*—Anjan Deb
*Assistant Examiner*—John Teresinski
(74) *Attorney, Agent, or Firm*—Brooks Kushman P.C.

(57) ABSTRACT

An electric circuit arrangement and method for checking intactness of both a photodiode array and an electrical connection between an array output and a microprocessor input. The array output has a high resistance when the array is inactive and intact. In case of array error, the array output is connected via in each case a defined internal resistance to ground and supply voltages. The circuit arrangement enables at any time an assessment of the status of the connection and, if the connection is intact, enables an assessment of array intactness. This is achieved by connecting the array output via a first test resistor arranged in the spatial vicinity of the array to the ground voltage and by connecting the microprocessor input via a second test resistor arranged in the spatial vicinity of the microprocessor to a microprocessor port output which can be connected either to the ground or supply voltages.

20 Claims, 1 Drawing Sheet

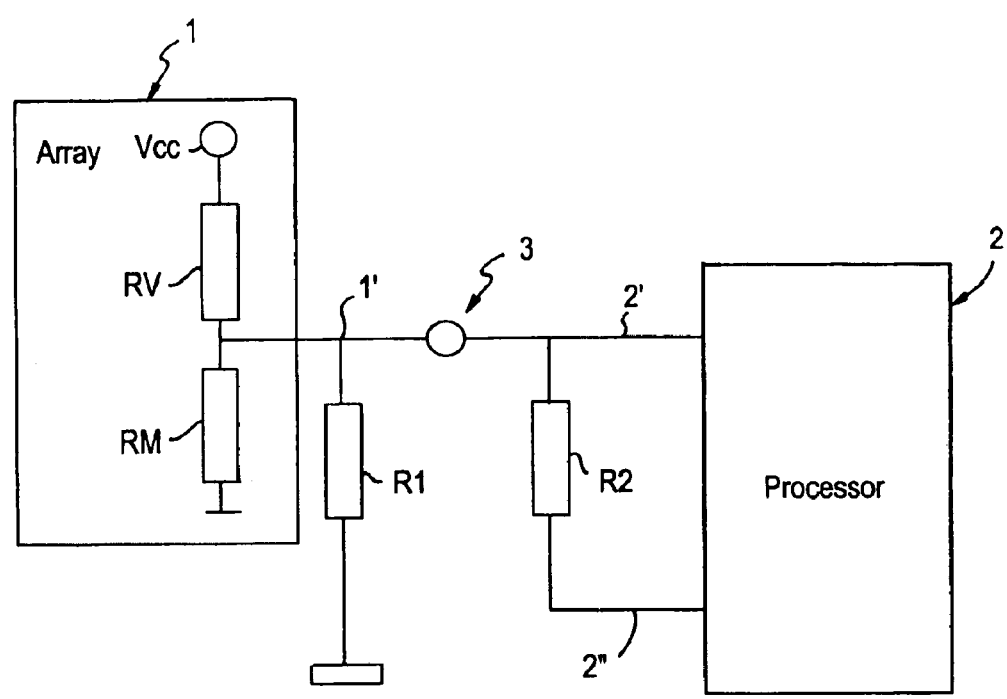

ELECTRIC CIRCUIT ARRANGEMENT AND METHOD FOR CHECKING THE INTACTNESS OF A PHOTODIODE ARRAY

BACKGROUND OF THE INVENTION

1. Field of the Invention

The present invention relates to an electric circuit arrangement and method for checking the intactness of a photodiode array and the intactness of an electrical connection between the array and a microprocessor. Such microprocessor being spatially separated from the array and being provided to evaluate an output signal of the array. Such output of the array having a high resistance or high impedance in the inactive, intact state and, in case of an error, being connected via in each case a defined internal resistance to a ground or a supply voltage potential.

2. Background Art

Photodiode arrays of the relevant type include a linear or planar arrangement of a multiplicity of photosensitive elements or sensors, generally designated as pixels, on a semiconductor chip or the like. Each of these pixels generates and provides an analog output signal representing the quantity of light incident on the pixel. Photodiode arrays are used in a number of optical sensor applications in which brightness information is required with spatial resolution. The analog output signals of the individual pixels are generally read out in sequence from the chip based on clock pulses and are then fed to an analog/digital converter (ADC) input of a microprocessor. The microprocessor converts the analog output signals of the individual pixels into digital signals or digital brightness values. An evaluation algorithm suitable for the particular application then processes the digital brightness signals further.

A possible application in particular of a row-based photodiode array is, e.g., an optoelectronic angle of rotation sensor, as is used, for instance, as a steering angle sensor in motor vehicles.

A sensor of this type is known from DE 40 22 837 A1. The steering angle sensor described in this document includes an electronic control unit and a sensor unit. The sensor unit includes two parallel elements arranged at a distance from one another—a light source and a row sensor—. The sensor unit further includes an encoder disk arranged between the light source and the row sensor. The encoder disk is locked to the steering column. The row sensor for the row-based photodiode array is a CCD sensor row.

In the encoder disk, an Archimedean spiral extending over 360° and formed as an optical slot is provided for encoding purposes. Based on the exposure of corresponding converter elements in the row sensor at a specific steering angle, the actual steering position can be determined. The Archimedean spiral used for encoding purposes is formed to extend continuously so that it can be addressed as an analog encoding. With the same arrangement, however, a digital encoding can also be read out equally well on the encoder disk, which can be implemented, for example, in the form of a gray code.

Due to space restrictions, it is often necessary in such applications to arrange the actual sensor unit, i.e., the row sensor and the light source, spatially separate from the associated electronic control and evaluation unit. This requires a more or less long electrical connection line between the units. The electrical connection line can be implemented in the form of plug contacts, foil conductors, etc. However, this connection always represents a potential source of additional errors which can manifest themselves, for example, in the form of contact problems or line cracks.

Conventional photodiode arrays do make it possible to directly assess the component itself based on the status of the output signal, but an undefined state will be present at a remotely arranged evaluation unit in case of an interruption to the electrical connection line.

SUMMARY OF THE INVENTION

Compared to the prior art, the electric circuit arrangement according to the present invention as well as the associated method have the advantage of enabling at any time an assessment of the status of the electrical connection line and, in case of the electrical connection line being intact, additionally enabling the assessment of the intactness of the photodiode array.

This is achieved in accordance with the present invention by connecting the output of the photodiode array via a first test resistor arranged in the spatial vicinity of the array to a ground potential and by connecting the analog/digital converter input of a microprocessor provided for reception of an output signal from the array via a second test resistor arranged in the spatial vicinity of the microprocessor to a port output of the microprocessor. The port output of the microprocessor can be connected either to the ground potential or a supply voltage potential.

By specifically connecting the second test resistor once to the ground potential and then to a supply voltage potential, this arrangement allows generation of defined voltage states at the analog/digital converter input of the microprocessor. These defined voltage states at the analog/digital converter input allow an assessment of the electrical connection line status as well as possibly allow an assessment of the intactness of the photodiode array.

BRIEF DESCRIPTION OF THE DRAWINGS

The FIGURE illustrates a block diagram of an electric circuit arrangement for checking the intactness of a photodiode array and checking the intactness of an electrical line connection between the array and a microprocessor in accordance with the present invention.

DETAILED DESCRIPTION OF THE PREFERRED EMBODIMENT(S)

As can be recognized from the FIGURE, the electric circuit arrangement according to the present invention includes a photosensor or photodiode array 1 and a microprocessor 2. Microprocessor 2 is provided to evaluate the analog output signal 1' of array 1. Array 1 and microprocessor 2 are located on two different circuit carriers or circuit boards which are interconnected via electrically conductive connection means 3. Connection means 3 may embody, for example, a plug-in connection which provides contact between track conductors of the two circuit boards arranged, e.g., with a vertical or perpendicular orientation with respect to one another or, perhaps, a flexible foil provided with track conductors which link together the corresponding potentials.

Array 1 contains, as integral components, two internal resistances RV and RM via which the analog signal output 1' is connected in case of a malfunction or an error either to a supply voltage ("Vcc") or a ground potential ("Gnd"). If array 1 is intact, analog signal output 1' has a high resistance in the inactive state, i.e., for example upon completion of clocked read-out of the analog output signal. On the circuit board of array 1, a first test resistor R1 is arranged additionally via which the output 1' of the array is connected to ground potential.

A second test resistor R2 is arranged on the circuit board of microprocessor 2. Second test resistor R2 connects the analog/digital converter input 2' of microprocessor 2 to a digital port output 2" of the microprocessor. Port output 2" of microprocessor 2 can be connected either to the ground potential ("Gnd") or to the supply voltage potential ("Vcc"). Analog/digital converter input 2' of microprocessor 2 is connected via an electrical line connection 3 to analog signal output 1' of array 1. Similarly, port output 2" of microprocessor 2 is connected via electrical line connection 3 to analog signal output 1' of array 1.

By connecting port output 2" and thus second test resistor R2 once to the ground potential and then to the supply voltage potential, defined voltage states are generated at analog/digital converter input 2' of microprocessor 2 in conjunction with first test resistor R1 as well as the output state of array 1. These voltage states enable, based on the following table (set up for R1=R2), an assessment of the electrical connection line status as well as possibly the intactness of array 1.

| Status | Port output = Vcc | Port output = Gnd |
|---|---|---|
| Normal connection, row OK (=high-resistance) | Voltage divider R1 and R2 → Vcc/2 | Both R pull to GND → Gnd |
| No connection, row doesn't matter | R2 pulls to VCC → Vcc | R2 pulls to Gnd → Gnd |
| Normal connection, Row lies with RM at Gnd | Voltage divider R2 and R1 ∥ RM → Vcc/2 to Gnd | Row, R1, R2 pull to Gnd → Gnd |
| Normal connection, Row lies with RV at Vcc | Voltage divider R2 ∥ RV and R1 → Vcc to Vcc/2 | Voltage divider RV and R1 ∥ R2 → Vcc to > Gnd |

While embodiments of the present invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. An electric circuit arrangement for checking the intactness of a photosensor array and for checking the intactness of an electrical connection between the photosensor array and a microprocessor spatially separated from the photosensor array, the electrical connection connecting an output of the photosensor array to an input of the microprocessor for the microprocessor to receive an output signal from the photosensor array for evaluation, the output of the photosensor array having a high resistance in an inactive state when the photosensor array is intact, the arrangement comprising:

a first test resistor connecting the output of the photosensor array to one of a ground voltage and a supply voltage, the first test resistor being in the spatial vicinity of the photosensor array on one side of the electrical connection; and a second test resistor connecting the input of the microprocessor to a port output of the microprocessor, the port output of the microprocessor being operable to be connected to either the ground voltage or the supply voltage, the second test resistor being in the spatial vicinity of the microprocessor on the other side of the electrical connection.

2. The arrangement of claim 1 wherein:

a first pair of voltage states are generated at the input of the microprocessor when the port output of the microprocessor is respectively connected to the ground and supply voltages and the electrical connection line is intact, the first pair of voltage states being indicative of the electrical connection line being intact;

wherein a second pair of voltage states are generated at the input of the microprocessor when the port output of the microprocessor is respectively connected to the ground and supply voltages and the electrical connection line is broken, the second pair of voltage states being indicative of the electrical connection line being broken.

3. The arrangement of claim 2 wherein:

the first and second test resistors each have a resistance equal in value;

wherein a first voltage state of the first pair of voltage states is one-half the supply voltage when the port output of the microprocessor is connected to the supply voltage, and a second voltage state of the first pair of voltage states is the ground voltage when the port output of the microprocessor is connected to the ground voltage;

wherein a first voltage state of the second pair of voltage states is the supply voltage when the port output of the microprocessor is connected to the supply voltage, and a second voltage state of the second pair of voltage states is the ground voltage when the port output of the microprocessor is connected to the ground voltage.

4. The arrangement of claim 2 further comprising:

first and second resistors internal to the photosensor array, wherein in case of an error to the photosensor array an internal end of the output of the photosensor array is connected to the ground voltage via the first internal resistor and, alternatively, is connected to the supply voltage via the second internal resistor.

5. The arrangement of claim 1 wherein:

the photosensor array is arranged on a first circuit board and the microprocessor is arranged on a second circuit board, the electrical connection being track conductors of the circuit boards which are interconnected in an electrically conductive manner.

6. The arrangement of claim 1 wherein:

the first and second test resistors each have a resistance equal in value.

7. The arrangement of claim 1 wherein:

the first test resistor connects the photosensor array to the ground voltage.

8. The arrangement of claim 1 further comprising:

first and second resistors internal to the photosensor array, wherein in case of an error to the photosensor array an internal end of the output of the photosensor array is connected to a ground voltage via the first internal resistor and, alternatively, is connected to a supply voltage via the second internal resistor.

9. An electric circuit arrangement for checking the intactness of a photosensor array and for checking the intactness of an electrical connection between the photosensor array and a microprocessor spatially separated from the photosensor array, the electrical connection connecting an output of the photosensor array to an input of the microprocessor for the microprocessor to receive an output signal from the photosensor array for evaluation, the output of the photosensor array having a high resistance in an inactive state when the photosensor array is intact, the arrangement comprising;
- a first test resistor connecting the output of the photosensor array to one of a ground voltage and a supply voltage, the first test resistor being in the spatial vicinity of the photosensor array on one side of the electrical connection;
- a second test resistor connecting the input of the microprocessor to a port output of the microprocessor, the port output of the microprocessor being operable to be connected to either the ground voltage or the supply voltage, the second test resistor being in the spatial vicinity of the microprocessor on the other side of the electrical connection; and
- first and second resistors internal to the photosensor array, wherein in case of an error to the photosensor array an internal end of the output of the photosensor array is connected to the ground voltage via the first internal resistor and, alternatively, is connected to the supply voltage via the second internal resistor;
- wherein a first pair of voltage states are generated at the input of the microprocessor when the port output of the microprocessor is respectively connected to the ground and supply voltages and the electrical connection line is intact, the first pair of voltage states being indicative of the electrical connection line being intact;
- wherein a second pair of voltage states are generated at the input of the microprocessor when the port output of the microprocessor is respectively connected to the ground and supply voltages and the electrical connection line is broken, the second pair of voltage states being indicative of the electrical connection line being broken;
- wherein a third pair of voltage states are generated at the input of the microprocessor when the internal end of the output of the photosensor array is connected to the ground voltage via the first internal resistor, the port output of the microprocessor is respectively connected to the ground and supply voltages, and the electrical connection line is intact;
- wherein the third pair of voltage states is indicative of the electrical connection line being intact and the internal end of the output of the photosensor array being connected to the ground voltage via the first internal resistor;
- wherein a fourth pair of voltage states are generated at the input of the microprocessor when the internal end of the output of the photosensor array is connected to the supply voltage via the second internal resistor, the port output of the microprocessor is respectively connected to the ground and supply voltages, and the electrical connection line is intact;
- wherein the fourth pair of voltage states are indicative of the electrical connection line being intact and the internal end of the output of the photosensor array being connected to the supply voltage via the second internal resistor.

10. The arrangement of claim 9 wherein:
the first and second test resistors each have a resistance equal in value;
wherein a first voltage state of the first pair of voltage states is one-half the supply voltage when the port output of the microprocessor is connected to the supply voltage, and a second voltage state of the first pair of voltage states is the ground voltage when the port output of the microprocessor is connected to the ground voltage;
wherein a first voltage state of the second pair of voltage states is the supply voltage when the port output of the microprocessor is connected to the supply voltage, and a second voltage state of the second pair of voltage states is the ground voltage when the port output of the microprocessor is connected to the ground voltage;
wherein a first voltage state of the third pair of voltage states falls within a range of one-half the supply voltage to the ground voltage when the port output of the microprocessor is connected to the supply voltage, and a second voltage state of the third pair of voltage states is the ground voltage when the port output of the microprocessor is connected to the ground voltage;
wherein a first voltage state of the fourth pair of voltage states falls within a range of the supply voltage to one-half the supply voltage when the port output of the microprocessor is connected to the supply voltage, and a second voltage state of the fourth pair of voltage states falls within a range of the supply voltage to the ground voltage when the port output of the microprocessor is connected to the ground voltage.

11. An electric circuit arrangement for checking the intactness of a photosensor array and for checking the intactness of an electrical connection between the photosensor array and a microprocessor spatially separated from the photosensor array, the electrical connection connecting an external end of an output of the photosensor array to an input of the microprocessor for the microprocessor to receive an output signal from the photosensor array for evaluation, the output of the photosensor array having a high resistance in an inactive state when the photosensor array is intact, the arrangement comprising:
- first and second resistors internal to the photosensor array, wherein in case of an error to the photosensor array an internal end of the output of the photosensor array is connected to a ground voltage via the first internal resistor and, alternatively, is connected to a supply voltage via the second internal resistor;
- a first test resistor connecting the external end of the output of the photosensor array to the ground voltage, the first test resistor being in the spatial vicinity of the photosensor array on one side of the electrical connection; and
- a second test resistor connecting the input of the microprocessor to a port output of the microprocessor, the port output of the microprocessor being operable to be connected to either the ground voltage or the supply voltage, the second test resistor being in the spatial vicinity of the microprocessor on the other side of the electrical connection.

12. The arrangement of claim 11 wherein:
a first pair of voltage states are generated at the input of the microprocessor when the port output of the microprocessor is respectively connected to the ground and supply voltages and the electrical connection line is intact, the first pair of voltage states being indicative of the electrical connection line being intact;
wherein a second pair of voltage states are generated at the input of the microprocessor when the port output of the microprocessor is respectively connected to the ground and supply voltages and the electrical connection line is broken, the second pair of voltage states being indicative of the electrical connection line being broken.

13. The arrangement of claim 12 wherein:
the first and second test resistors each have a resistance equal in value;
wherein a first voltage state of the first pair of voltage states is one-half the supply voltage when the port output of the microprocessor is connected to the supply voltage, and a second voltage state of the first pair of voltage states is the ground voltage when the port output of the microprocessor is connected to the ground voltage;
wherein a first voltage state of the second pair of voltage states is the supply voltage when the port output of the microprocessor is connected to the supply voltage, and a second voltage state of the second pair of voltage states is the ground voltage when the port output of the microprocessor is connected to the ground voltage.

14. The arrangement of claim 11 wherein:
the photosensor array is arranged on a first circuit board and the microprocessor is arranged on a second circuit board, the electrical connection being track conductors of the circuit boards which are interconnected in an electrically conductive manner.

15. An electric circuit arrangement for checking the intactness of a photosensor array and for checking the intactness of an electrical connection between the photosensor array and a microprocessor spatially separated from the photosensor array, the electrical connection connecting an external end of an output of the photosensor array to an input of the microprocessor for the microprocessor to receive an output signal from the photosensor array for evaluation, the output of the photosensor array having a high resistance in an inactive state when the photosensor array is intact, the arrangement comprising:
first and second resistors internal to the photosensor array, wherein in case of an error to the photosensor array an internal end of the output of the photosensor array is connected to a ground voltage via the first internal resistor and, alternatively, is connected to a supply voltage via the second internal resistor;
a first test resistor connecting the external end of the output of the photosensor array to the ground voltage, the first test resistor being in the spatial vicinity of the photosensor array on one side of the electrical connection; and
a second test resistor connecting the input of the microprocessor to a port output of the microprocessor, the port output of the microprocessor being operable to be connected to either the ground voltage or the supply voltage, the second test resistor being in the spatial vicinity of the microprocessor on the other side of the electrical connection;
wherein a first pair of voltage states are generated at the input of the microprocessor when the port output of the microprocessor is respectively connected to the ground and supply voltages and the electrical connection line is intact, the first pair of voltage states being indicative of the electrical connection line being intact;
wherein a second pair of voltage states are generated at the input of the microprocessor when the port output of the microprocessor is respectively connected to the ground and supply voltages and the electrical connection line is broken, the second pair of voltage states being indicative of the electrical connection line being broken;
wherein the first and second test resistors each have a resistance equal in value;
wherein a first voltage state of the first pair of voltage states is one-half the supply voltage when the port output of the microprocessor is connected to the supply voltage, and a second voltage state of the first pair of voltage states is the ground voltage when the port output of the microprocessor is connected to the ground voltage;
wherein a first voltage state of the second pair of voltage states is the supply voltage when the port output of the microprocessor is connected to the supply voltage, and a second voltage state of the second pair of voltage states is the ground voltage when the port output of the microprocessor is connected to the ground voltage;
wherein a third pair of voltage states are generated at the input of the microprocessor when the internal end of the output of the photosensor array is connected to the ground voltage via the first internal resistor, the port output of the microprocessor is respectively connected to the ground and supply voltages, and the electrical connection line is intact;
wherein the third pair of voltage states is indicative of the electrical connection line being intact and the internal end of the output of the photosensor array being connected to the ground voltage via the first internal resistor;
wherein a fourth pair of voltage states are generated at the input of the microprocessor when the internal end of the output of the photosensor array is connected to the supply voltage via the second internal resistor;
wherein the fourth pair of voltage states are indicative of the electrical connection line being intact and the internal end of the output of the photosensor array being connected to the supply voltage via the second internal resistor.

16. The arrangement of claim 15, wherein:
a first voltage state of the third pair of voltage states falls within a range of one-half the supply voltage to the ground voltage when the port output of the microprocessor is connected to the supply voltage, and a second voltage state of the third pair of voltage states is the ground voltage when the port output of the microprocessor is connected to the ground voltage;
wherein a first voltage state of the fourth pair of voltage states falls within a range of the supply voltage to one-half the supply voltage when the port output of the microprocessor is connected to the supply voltage, and a second voltage state of the fourth pair of voltage states falls within a range of the supply voltage to the ground voltage when the port output of the microprocessor is connected to the ground voltage.

17. A method for checking the intactness of a photosensor array and for checking the intactness of an electrical connection between the photosensor array and a microprocessor spatially separated from the photosensor array, the electrical connection connecting an output of the photosensor array to an input of the microprocessor for the microprocessor to receive an output signal from the photosensor array for evaluation, the output of the photosensor array having a high resistance in an inactive state when the photosensor array is intact, the method comprising:
connecting a first test resistor, in the spatial vicinity of the photosensor array on one side of the electrical connection, between the output of the photosensor array and a ground voltage;
connecting a second test resistor, in the spatial vicinity of the microprocessor on the other side of the electrical connection, between the input of the microprocessor and a port output of the microprocessor;

connecting the port output of the microprocessor to only one of the ground voltage and a supply voltage; and connecting the port output of the microprocessor to only one of the other one of the ground voltage and the supply voltage.

18. The method of claim 17 wherein:

a first pair of voltage states are generated at the input of the microprocessor when the port output of the microprocessor is respectively connected to the ground and supply voltages and the electrical connection line is intact, and a second pair of voltage states are generated at the input of the microprocessor when the port output of the microprocessor is respectively connected to the ground and supply voltages and the electrical connection line is broken, the method further comprising evaluating the first and second pairs of voltage states generated at the input of the microprocessor when the port output of the microprocessor is respectively connected to the ground and supply voltages in order to determine whether the electrical connection line is intact or broken.

19. The method of claim 18 further comprising:

providing first and second resistors internal to the photosensor array;

in case of an error to the photosensor array, connecting the first internal resistor between an internal end of the output of the photosensor array and the ground voltage and then, alternatively, connecting the second internal resistor between the internal end of the output of the photosensor array and the supply voltage.

20. A method for checking the intactness of a photosensor array and for checking the intactness of an electrical connection between the photosensor array and a microprocessor spatially separated from the photosensor array, the electrical connection connecting an output of the photosensor array to an input of the microprocessor for the microprocessor to receive an output signal from the photosensor array for evaluation, the output of the photosensor array having a high resistance in an inactive state when the photosensor array is intact, the method comprising:

connecting a first test resistor, in the spatial vicinity of the photosensor array on one side of the electrical connection, between the output of the photosensor array and a ground voltage;

connecting a second test resistor, in the spatial vicinity of the microprocessor on the other side of the electrical connection, between the input of the microprocessor and a port output of the microprocessor;

connecting the port output of the microprocessor to only one of the ground voltage and a supply voltage;

connecting the port output of the microprocessor to only one of the other one of the ground voltage and the supply voltage;

providing first and second resistors internal to the photosensor array; and in case of an error to the photosensor array, connecting the first internal resistor between an internal end of the output of the photosensor array and the ground voltage and then, alternatively, connecting the second internal resistor between the internal end of the output of the photosensor array and the supply voltage;

wherein a first pair of voltage states are generated at the input of the microprocessor when the port output of the microprocessor is respectively connected to the ground and supply voltages and the electrical connection line is intact, and a second pair of voltage states are generated at the input of the microprocessor when the port output of the microprocessor is respectively connected to the ground and supply voltages and the electrical connection line is broken, the method further comprising evaluating the first and second pairs of voltage states generated at the input of the microprocessor when the port output of the microprocessor is respectively connected to the ground and supply voltages in order to determine whether the electrical connection line is intact or broken;

wherein a third pair of voltage states are generated at the input of the microprocessor when the internal end of the output of the photosensor array is connected to the ground voltage via the first internal resistor, the port output of the microprocessor is respectively connected to the ground and supply voltages, and the electrical connection line is intact;

wherein a fourth pair of voltage states are generated at the input of the microprocessor when the internal end of the output of the photosensor array is connected to the supply voltage via the second internal resistor, the port output of the microprocessor is respectively connected to the ground and supply voltages, and the electrical connection line is broken;

the method further comprising evaluating the third and fourth pairs of voltage states generated at the input of the microprocessor when the port output of the microprocessor is respectively connected to the ground and supply voltages in order to determine whether the electrical connection line is intact or broken and the internal status of the photosensor array.

* * * * *